ELECTRONIC CIRCUIT

Filed Feb. 12, 1960 2 Sheets-Sheet 1

INVENTOR
CLEVE C. NASH

BY John C Black
ATTORNEY.

INVENTOR
CLEVE C. NASH

BY John C Black
ATTORNEY

United States Patent Office 3,046,508

Patented July 24, 1962

3,046,508
ELECTRONIC CIRCUIT

Cleve C. Nash, Santa Barbara, Calif., assignor to Stewart-Warner Corporation, Chicago, Ill., a corporation of Virginia Filed Feb. 12, 1960, Ser. No. 8,432
5 Claims. (Cl. 334—15)

This invention relates to the use of semi-conductors as variable capacitors and to resonant circuits incorporating semi-conductor tuning means.

The use of a silicon p-n junction diode as a voltage variable capacitor is known in the art. However, it is well recognized that because of its unusually high internal impedance, its practical use in electronic circuits is somewhat limited.

It is an object of the present invention to provide a semi-conductor junction device as a voltage variable capacitor with relatively low internal impedance whereby the area of a practical commercial use is substantially widened.

It is a more specific object of the present invention to use a transistor having two junctions separated by a very thin base layer as two capacitances in series, the effective Q of which is high enough to be useful in tuned radio frequency circuits. It has been found that alloyed p-n-p transistors provide optimum performance in this area of use.

It is another primary object of the present invention to use a plurality of series connected transistors energized by selected base biasing signals for substantially widening the range of frequencies to which a tuned circuit may be adjusted.

It is a more specific object to connect two transistors in series across an inductance to form a broad band anti-resonant circuit. The reverse bias voltage of both transistors is simultaneously varied. This results in a variation through one range of the series connected capacitances of both transistors. Then the reverse bias of only one of the transistors is varied while a short-circuiting forward bias is applied to the other transistor. This results in a variation of the capacitance of the one transistor through another range. By selecting the one transistor with a capacitance which is slightly larger than the capacitance of the other transistor, for example 9 μμf. and 18 μμf., the two ranges will be consecutive. The series connected transistors' capacitance may be varied from 6 μμf. to 18 μμf. and the one transistor's capacitance may be varied from 18 μμf. to 54 μμf.

Other objects and various features of the invention will be apparent upon the perusal of the following description taken in conjunction with the drawings in which.

Briefly, the present invention contemplates the use in the preferred embodiment of an alloy p-n-p junction transistor having a very thin base layer of two capacitances in series. In the preferred embodiment, two such transistors are connected in series and one of the transistors is reverse biased preferably from in the order of —12 volts to —1 volt cyclically with a saw-tooth pattern and the other transistor is cyclically reverse biased from in the order of —12 volts to 0 volt and then forward biased at +12 volts to cause effective short-circuiting of its capacitance by reason of high conduction through the transistor. The capacitance range over which the transistors may be varied is thereby substantially increased.

In a preferred commercial utilization, the series connected transistors are connected across an inductance to form an anti-resonance circuit which is resonant over a wide frequency range. As indicated earlier, optimum results are obtained with junction devices of the alloyed p-n-p junction transistor type.

Figures 1, 2, 3:
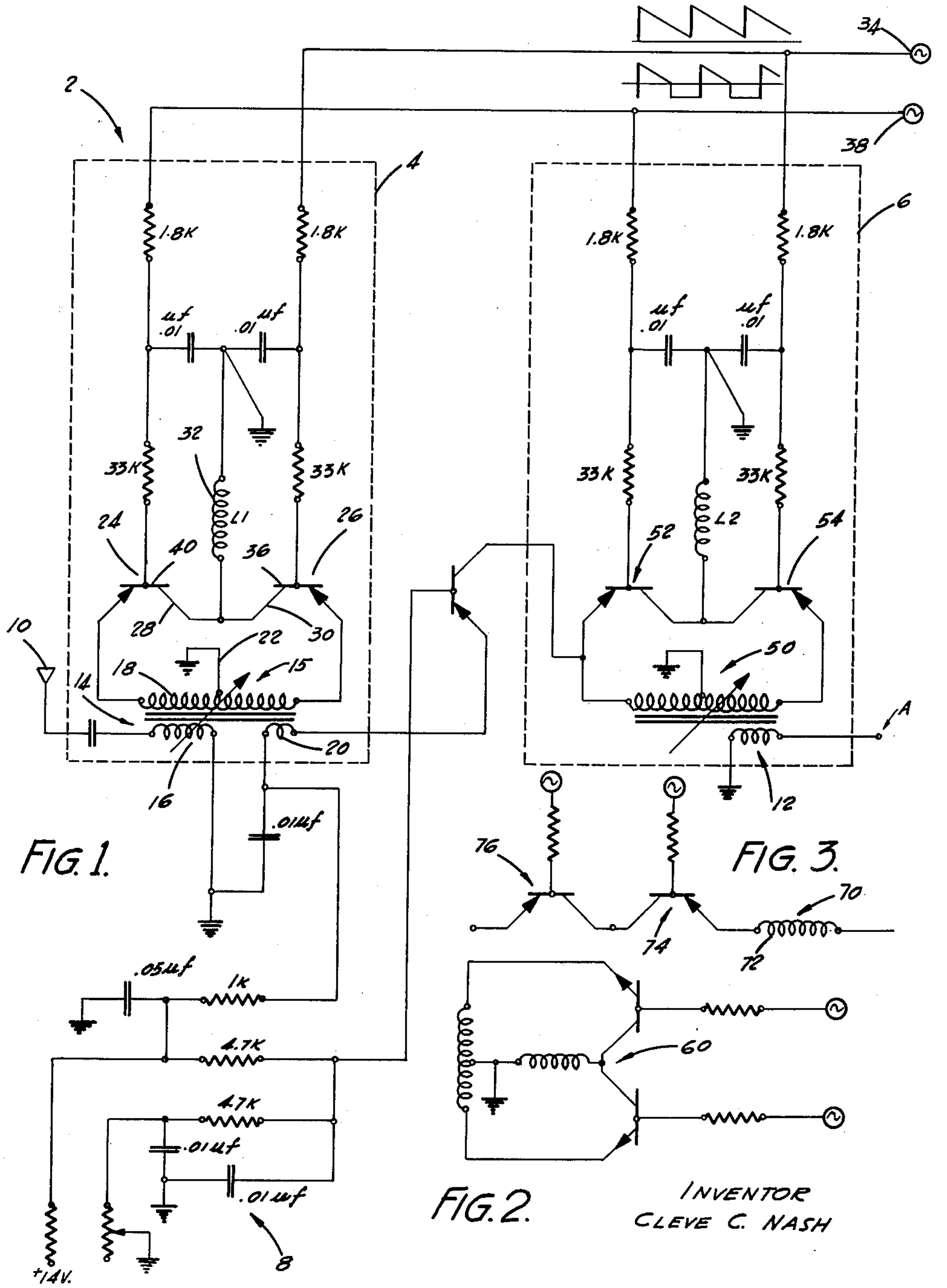
FIG. 1 is a schematic diagram of cascaded frequency selective amplifiers utilizing the teachings of the present invention.
FIG. 2 is a partial schematic diagram of a modification of FIG. 1 showing the use of n-p-n junction transistors instead of p-n-p junction transistors.
FIG. 3 is a modification of the embodiment of FIG. 1 utilizing the teachings of the present invention in a series resonant circuit.

With particular reference to FIG. 1, a cascaded variable selective radio frequency amplifier circuit 2 comprises a first amplifier section 4 and a second amplifier section 6 interconnected by an amplifying transistor circuit 8. The section 4 is connected to an antenna 10 and the output 12 of the second amplifier section 6 may be connected to well known electronic circuits for detection purposes. The circuit 2 is designed to periodically scan a desired band of frequencies and selectively amplify frequencies detected within the band for application to well known detection equipment.

The amplifier section 4 includes a transformer 14 having a primary coil 16 and secondary coils 18 and 20. The secondary coil 18 is grounded at 22 and is connected across a pair of series connected p-n-p junction transistors 24 and 26 to form an anti-resonant circuit 15. The interconnected transistor junctions 28 and 30 are connected to ground by way of a radio frequency choke 32.

The self-resonant frequency of the choke 32 must be substantially higher than the frequency range of the anti-resonant circuit 15 and it should have an inductance in the order of ten times the inductance of the coil 18 so as not to substantially affect the inductance of the anti-resonant circuit 15.

A signal generator 34 is connected to the base 36 of the transistor 26 to reverse bias the transistor junctions thereby to vary the effective capacitance of the transistor. The signal signal produced by the generator 34 preferably has a saw-tooth wave form varying from approximately —12 volts to —1 volt at the rate of approximately 40 c.p.s.

Figure 4:
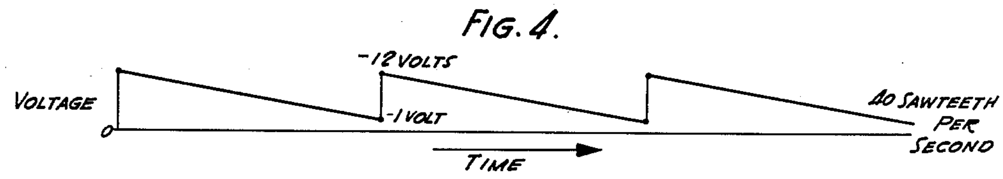
FIGS. 4–8 show typical wave forms utilized in and obtainable from the embodiment of FIG. 1.
Figure 5:
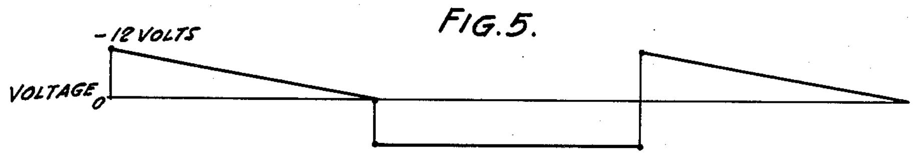

A second signal generator 38 is connected to the base 40 of the transistor 24 to cyclically reverse bias the junctions from approximately 12 volts to 0 volt then forward bias the transistors to a desired voltage for high conduction by the transistor. This signal is synchronized with the signal of the generator 34 as seen in FIGS. 4 and 5.

Figure 6:
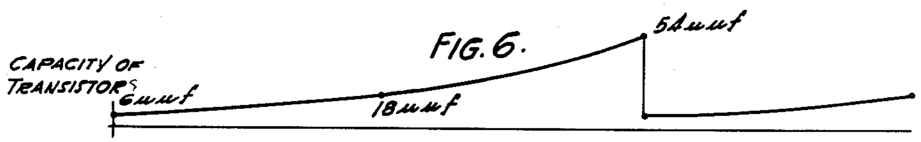

A detailed discussion of the operation of the amplifier section 4 will now be made. With reference to FIGS. 4, 5 and 6, it will be seen that transistor 24 may be a 2N270 with a capacitance of about 9 μμf. at —12 volts bias. Transistor 26 may be a 2N226 with a capacitance of about 18 μμf. at —12 volts bias. The overall effective capacity of the transistors 24 and 26 will vary from 6 μμf. to 18 μμf. as the reverse biasing voltage on the base 36 varies from —12 volts to —1 volt and the reverse bias on the base 40 varies from —12 volts to 0 volt. This point in time, at which the effective capacitance has reached 18 μμf., is conveniently referred to as the crossover point. At this time, switching must be made in such a manner that the effective capacitance of the circuit does not substantially vary.

The effective capacitance of the transistor 26 is lowered as a result of instantaneously increasing the reverse bias from —1 volt to —12 volts. At the same time, the transistor 24 is forward biased instantaneously for substantial conduction which appears as a short circuit of its capacitance. The applicant has conveniently maintained the overall effective capacitance substantially constant at the crossover point by the simple expedient of selecting a transistor 26 which has a junction capacitance slightly greater than twice that of transistor 24 at the same reverse bias voltage. With transistors having these relative capacitance characteristics, the effective capacitance of the series connected transistors now varies from 18 μμf. to a value in the order of 54 μμf.

Thus it can be seen that for one complete cycle of the signal generators 34 and 38, a capacitance varying from 6 μμf. to 54 μμf. is connected across the secondary coil 18. The inductance of the coil 18 and the varying capacitance results in a corresponding variance in the resonant frequency of the anti-resonance circuit 15 formed by the coil and transistors.

Signals received by the antenna 10 and applied across the primary coil 16 produce corresponding signals in the secondary winding 20. However, the amplitude of these signals in the secondary coil 20 are controlled by the anti-resonant circuit 15. Thus the signal picked up by the antenna 10 produces a corresponding signal of appreciable amplitude in the coil 20 only in the event that the circuit 15 is momentarily tuned to the signal frequency.

Figure 7:
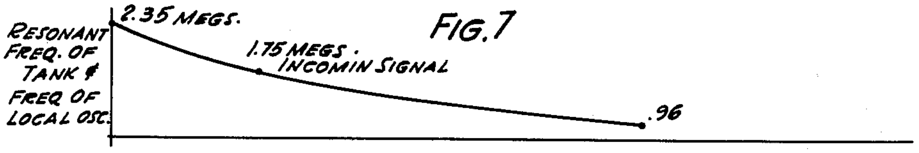
Figure 8:
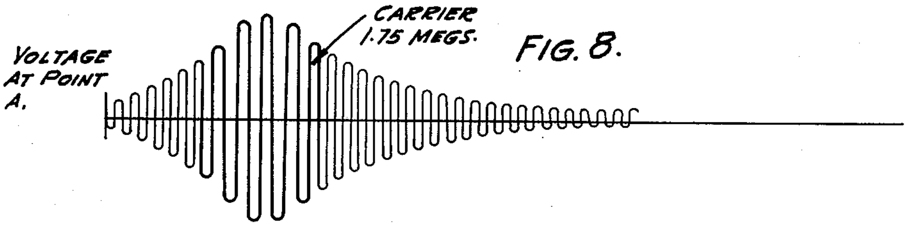

The circuit 15 is tuned from 2.35 mc. to .96 mc. Hence an incoming signal having a frequency of 1.75 mc. will be amplified as the resonant frequency of the circuit 15 passes through an equivalent resonant point. This selective function is shown in the graphs of FIGS. 7 and 8. The signals in secondary winding 20 are applied to the second amplifier section 6 by way of the amplifier circuit 8. The signals are further selectively amplified by the section 6 before application to well known detection apparatus (not shown).

The section 6 includes an anti-resonant circuit 50 generally similar to the circuit 15. The circuit 50 includes transistors 52 and 54 connected to the signal generators 38 and 34 respectively. The instantaneous resonant point of the circuit 50 is thus varied from 2.35 mc. to .96 mc. in synchronism with and in the same manner as the circuit 15.

In the embodiment of FIG. 2 an anti-resonant circuit 60 is generally similar to the circuits 15 and 50 except that n-p-n junction transistors are used. In this instance, the only change required is that the polarity of the wave forms of FIGS. 4 and 5 be reversed. A selected frequency band may be scanned in a similar manner as that described above by incorporating the tank circuit of FIG. 2 into the embodiment of FIG. 1.

It will be appreciated that diodes may be similarly controlled in a circuit such as that of FIG. 1. However, diodes in their present state of employment introduce too low a Q in the anti-resonant circuit.

FIG. 3 is a schematic diagram of a series resonant circuit 70 comprising an inductive coil 72 and transistors 74 and 76 connected in series with the coil 72. By varying the bias voltages applied to the transistors 74 and 76 in the manner described above with respect to FIG. 1, the resonant frequency of the circuit 70 may be varied.

While there have been described what are believed at present to be the preferred embodiments of the invention, it will be appreciated that various changes and modifications may be made therein; and it is contemplated to cover in the accompanying claims all such changes and modifications as fall within the true spirit and scope of the invention.

What is claimed is:

1. A variable frequency resonant circuit comprising an inductive coil, a pair of series connected transistors connected in series with the coil, and signal generating apparatus applying a varying reverse bias voltage to the transistors to vary their effective capacitances in synchronism and subsequently applying a varying reverse bias voltage to one transistor to vary its capacitance while simultaneously forward biasing the other transistor to cause an effective short circuit.

2. A variable frequency circuit comprising an inductive coil, a pair of series connected transistors connected across the coil, and signal generating apparatus applying a varying reverse bias voltage to the transistors to vary their effective capacitances in synchronism and subsequently applying a varying reverse bias voltage to one transistor to vary its capacitance while simultaneously forward biasing the other transistor to cause an effective short circuit.

3. A variable selective radio frequency circuit comprising a tuned circuit including an inductive coil and a pair of series connected junction transistors connected across said coil, means producing signals to cyclically apply a varying reverse bias to the bases of both transistors in synchronism and then to apply a varying reverse bias to only one of the transistors while applying a forward bias to the base of the other transistor to vary the effective capacity of the transistors over a wide range, means applying incoming signals to the tuned circuit, and output signal means coupled to the tuned circuit receiving incoming signals corresponding to a resonant frequency of the tuned circuit.

4. A variable selective radio frequency circuit comprising a tuned circuit including an inductive coil and a pair of series connected junction transistors connected across said coil, means producing signals to cyclically apply a varying reverse bias to the bases of both transistors in synchronism and then to apply a varying reverse bias to only one of the transistors while applying a forward bias to the base of the other transistor to vary the effective capacity of the transistors over a range in the order of nine to one, means applying incoming signals to the tuned circuit and output signal means coupled to the tuned circuit receiving incoming signals corresponding to a resonant frequency of the tuned circuit.

5. A variable frequency resonant circuit comprising an inductance coil, a pair of series connected transistors connected to said coil, one of said transistors having a junction capacity supply greater than twice the junction capacity of the other transistor at the same reverse bias voltage, and signal generating apparatus applying a varying reverse bias voltage to the transistors to vary their effective capacitances in synchronism and subsequently applying reverse bias voltage to said one transistor to vary its capacitance while simultaneously forward biasing the other transistor to cause an effective short-circuit.

References Cited in the file of this patent

UNITED STATES PATENTS

| | | |
|---|---|---|
| 2,750,452 | Goodrich | June 12, 1956 |
| 2,764,687 | Buchanan et al. | Sept. 25, 1956 |
| 2,888,648 | Herring | May 26, 1959 |